United States Patent [19]
Kim et al.

[11] Patent Number: 5,754,487
[45] Date of Patent: May 19, 1998

[54] BIT LINE PRECHARGE CIRCUIT

[75] Inventors: Du-Eung Kim; Choong-Keun Kwak; Young-Ho Suh, all of Suwon; Hyun-Geun Byun, Kyungki-do, all of Rep. of Korea

[73] Assignee: Samsung Electronics Co., Ltd., Suwon, Rep. of Korea

[21] Appl. No.: 749,277

[22] Filed: Nov. 13, 1996

[30] Foreign Application Priority Data

Nov. 13, 1995 [KR] Rep. of Korea ............... 40996/1995

[51] Int. Cl.$^6$ ............................................. G11C 7/00
[52] U.S. Cl. .................... 365/203; 365/233.5; 365/154; 365/156
[58] Field of Search ..................... 365/203, 233.5, 365/154, 156

[56] References Cited

U.S. PATENT DOCUMENTS

| | | | |
|---|---|---|---|
| 4,996,671 | 2/1991 | Suzuki et al. | 365/203 |
| 5,047,671 | 9/1991 | Monden | 365/233.5 X |
| 5,091,889 | 2/1992 | Hamano et al. | 365/203 |
| 5,199,002 | 3/1993 | Ang et al. | 365/233.5 |
| 5,268,874 | 12/1993 | Yamauchi | 365/233.5 |
| 5,305,268 | 4/1994 | McClure | 365/203 |

*Primary Examiner*—David C. Nelms
*Assistant Examiner*—Huan Hoang
*Attorney, Agent, or Firm*—Marger, Johnson, McCollom & Stolowitz, PC

[57] ABSTRACT

An SRAM, which includes a plurality of bit line pairs, a memory cell connected between each pair of the bit lines, and an address transition detection circuit for detecting transition of the externally applied address signal to generate a detection pulse signal, is provided with an improved bit line precharge circuit requiring only two transistors per bit line pair. The new precharge circuit is controlled by a bit line precharge control signal generator for generating a control signal determined by a ratio of impedances connected between a source voltage and ground voltage.

12 Claims, 5 Drawing Sheets

1

BIT LINE PRECHARGE CIRCUIT

BACKGROUND OF THE INVENTION

1. Field of the Invention

The present invention is in the field of semiconductor memory devices, and more specifically pertains to improved methods and apparatus for precharging bit lines in static semiconductor memory (SRAM) devices.

The present application is based on Korean Application No. 40996/1995 which is incorporated herein by this reference.

2. Description of Related Art

The bit line precharge circuit of a static random access memory (SRAM) generally comprises pulse precharge transistors controlled by the output of an address transition detection circuit, and static precharge transistors which are always kept turned on. The sizes of the static precharge transistors affect the amount of current consumption in the device and the operating speed, so their role is critically important. Because the voltage level of the bit lines being precharged tends to decay as a result of current leakage, the use of static precharge transistors is essential in the prior art to avoid erroneous operation of the memory. However, when each of the bit lines is provided with precharge transistors, the area of the circuit layout is considerably increased.

FIGS. 1A to 1C illustrate the precharge and control signal generating circuits used in a conventional SRAM. In FIG. 1A, an address buffer 10 delivers an external address signal to an address transition detection circuit 11 which in turn generates a pulse signal PULSE. In response to a block select signal BSI and the pulse signal PULSE and a write signal /WE, NAND gates 12 and 13 in FIG. 1B generate bit line control signals as follows. A first bit line control signal /PBL2 is to control PMOS transistors 15A and 15B, and a second bit line control signal /PBL1 controls the gates of PMOS transistors 14A and 14B, as shown in FIG. 1C. In this description we use the virgule ("/") in lieu of a horizontal bar over the signal name to indicate the complement or active-low signal. Cross-coupled PMOS transistors 17 and 18 are controlled by the voltages applied to the bit line pair BL and /BL. Transistors 17 and 18 are static precharge transistors turned off during write operations. Typically the PMOS transistors 15A and 15B have greater area than the PMOS transistors 14A and 14B.

The PMOS transistors 15A and 15B operate only in the write mode, and the PMOS transistors 14A and 14B are turned on at all times only during a read operation. PMOS transistors 17 and 18 are crosswise connected between the bit line BL and the complementary bit line /BL to compensate for the level decrease of the bit lines in the long cycle mode. Thus the prior art precharge and related control circuitry requires six transistors per bit line pair and therefore uses a significant amount of chip area.

FIG. 2 shows timing diagrams illustrating the operation of bit line precharge using the circuits just described. The drawing shows a write cycle followed by a read cycle. The address transition detection circuit 11 detects the transition of the external address signal XAi to generate the pulse signal PULSE. That signal in turn enables the NAND gates described above to produce the bit line control signal /PBL2, which subsequently turns on the PMOS transistors 15A and 15B for precharging the bit line.

In a write operation, the external write enable signal /WE goes low, thereby driving the bit line control signal /PBL1 high, so that the PMOS transistors 14A and 14B are turned off. In the long cycle mode, where there is a relatively long period after the address transition, current leakage causes a gradual decrease of the bit line voltage. This decay is however compensated for by the crosswise connected transistors 17 and 18 as is known. The tradeoffs of the operating speed and current consumption in precharging the bit lines, as described above, complicates the control of the precharge transistors as well as increases the area of the layout.

SUMMARY OF THE INVENTION

In view of the foregoing background, it is an object of the present invention to reduce the circuit area of a bit line precharge circuit in an SRAM.

According to one embodiment of the present invention, an SRAM, which includes a plurality of bit line pairs, a memory cell connected between each pair of the bit lines, and an address transition detection circuit for detecting transition of the externally applied address signal to generate a detection pulse signal, is provided with a new bit line precharge circuit. The bitline precharge circuit includes a bit line control signal generator for generating a bit line control signal having a voltage level responsive to a ratio of impedances connected between a source voltage Vcc and ground voltage. This bit line control signal may have the same or different levels in reading and writing operations. In the bit line control signal generator circuit, a plurality of precharge transistors have channels arranged in series between the source voltage (Vcc) and the bit line pair, with the gates of said transistors being controlled by the bit line control signal.

According to another embodiment of the present invention, an SRAM, which includes a plurality of bit line pairs, a memory cell connected between each pair of the bit lines, and an address transition detection circuit for detecting transition of the externally applied address signal to generate a detection pulse signal, is provided with a bit line precharge circuit comprising a bit line control signal generator for generating a bit line control signal (/PBL in FIG. 4) having a voltage level that varies in a range between the voltage obtained by subtracting the threshold voltage from a source voltage and ground voltage, i.e. Vcc–Vt and ground (or Vss). The bit line control signal generator includes a plurality of precharge transistors with the channels arranged in series between the source voltage Vcc and a bit line pair and the gates again being controlled by the bit line control signal.

The present invention will now be described in a preferred embodiment more specifically with reference to the drawings.

DETAILED DESCRIPTION OF THE PREFERRED EMBODIMENT

Figure 1A:
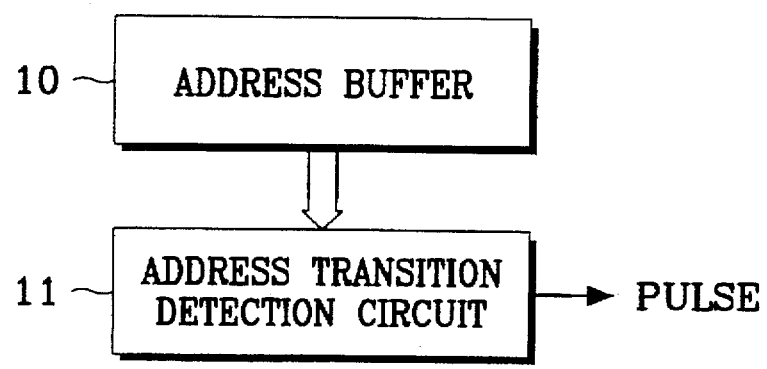
FIGS. 1A, 1B and 1C illustrate a conventional bit line control signal generating and precharge control circuit.
Figure 1B:
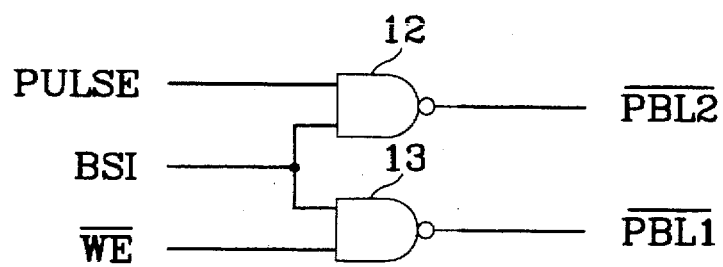
Figure 1C:
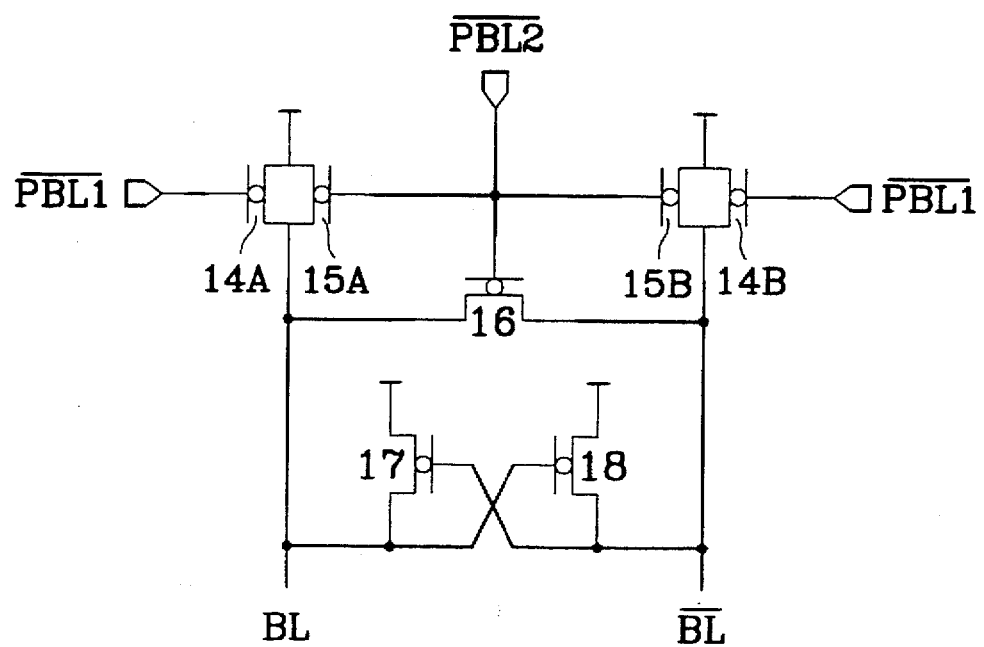
Figure 2:
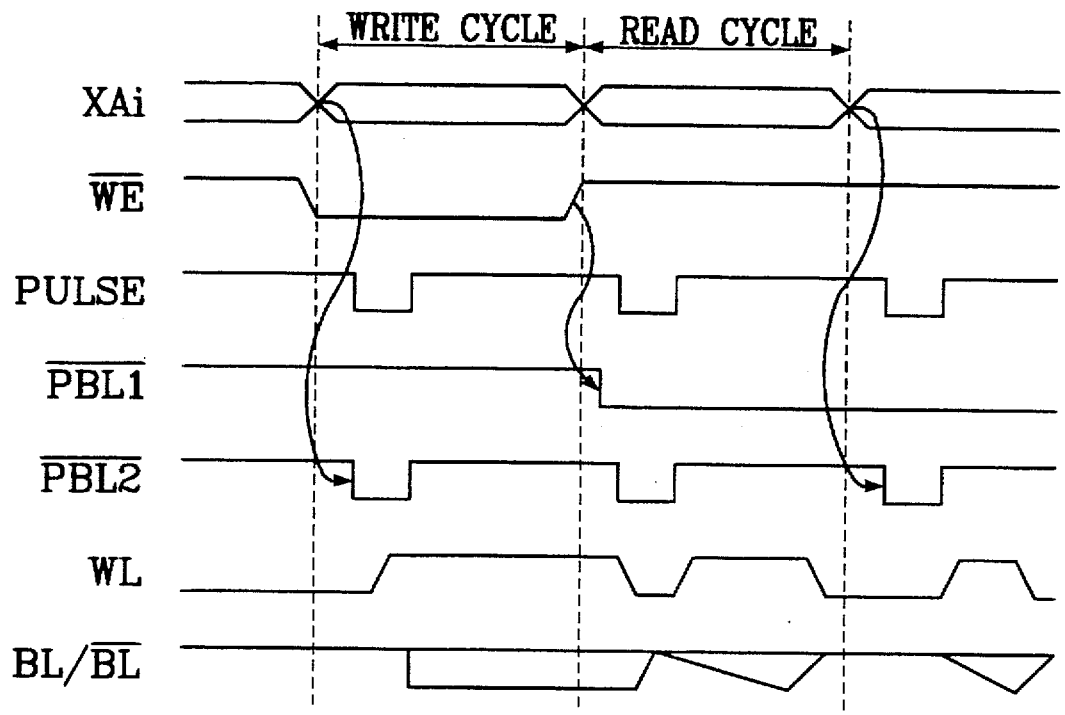
FIG. 2 is a timing diagram for illustrating operation of the bit line control signal generating and precharge control circuitry of FIGS. 1A–1C.
Figure 3A:
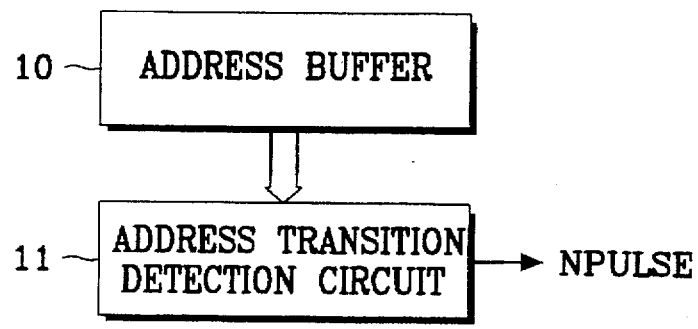
FIG. 3A is a block diagram of a conventional address transition detection system (ATD)
Figure 3B:
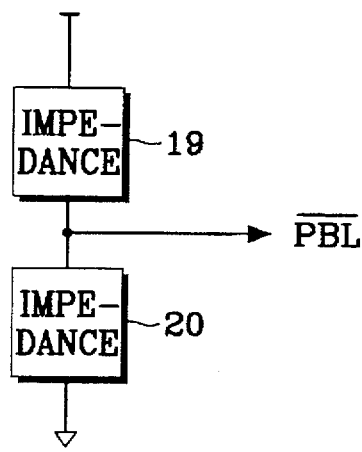
FIG. 3B is a functional block diagram of a bit line precharge control signal generating circuit according to a preferred embodiment of the present invention.
Figure 3C:
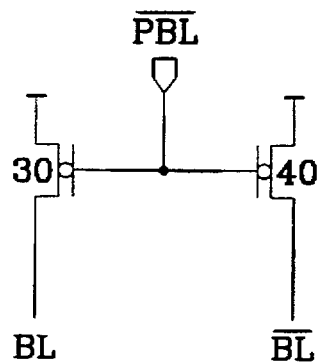
FIG. 3C is a schematic diagram of a bit line precharge circuit according to an embodiment of the present invention.

Referring to FIGS. 3A to 3C, an address buffer 10 delivers an external address signal to an address transition detection circuit 11 to generate a pulse signal NPULSE. The ratio between impedances 19 and 20 determines the level of a bit line control signal /PBL to control PMOS precharge transistors 30 and 40.

Figure 4:
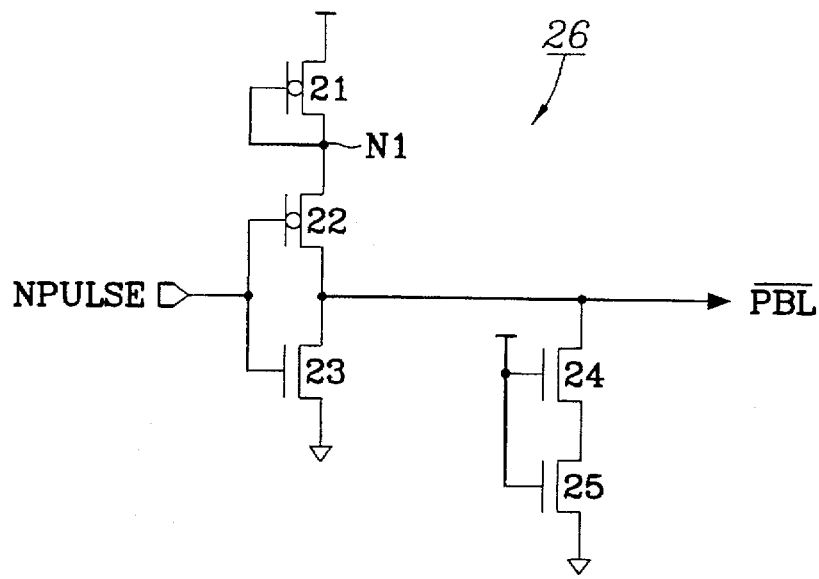
FIG. 4 is a schematic diagram illustrating a bit line precharge control signal generator according to the present invention.

FIG. 4 is a schematic diagram showing a bit line control signal generator in greater detail. This circuit comprises a plurality of transistors 21 to 23 arranged with the channels in series between a source voltage (Vcc) and ground voltage, and NMOS transistors 24 and 25 having their channels arranged in series between an output node and ground voltage. The output node is connected to the drain of transistor 22 and the source of transistor 23. The transistors 21 and 22 are PMOS type, and the transistor 23 is NMOS type. The gate of the PMOS transistor 21 is connected to the drain of transistor 21 and to the source of the PMOS transistor 22 at node N1. The pulse signal NPULSE described above is applied to an input node connected to the gates of the PMOS transistor 22 and NMOS transistor 23. Operation of the circuit is described further with reference to the timing diagram of FIG. 5.

Responsive to detecting the address signal transition, the address transition detection circuit 11 generates the pulse signal NPULSE, which in turn is applied to the bit line control signal generator 26 input node. That pulse turns on the NMOS transistor 23, so that the bit line control signal /PBL goes to a low level to turn on the precharge transistors 30 and 40 (see FIG. 3C). Node N1 connecting the drain of the PMOS transistor 21 and the source of the PMOS transistor 22 is pulled up to voltage Vcc–Vt obtained by subtracting the threshold voltage from the source voltage. Transistors 24 and 25 are to adjust or modulate the voltage level of the bit line control signal responsive to the impedance ratio between the transistors 21 and 22 on the one hand forming a first impedance, and transitions 24 and 25 together forming the denominator or second impedance. Transistors 21,22 thus correspond to the impedance 19 in FIG. 3B, while transistors 23,24,25 correspond to the impedance 20 in FIG. 3B. The present embodiment is to control the level of the bit line control signal by Vcc–Vt.

Figure 5:
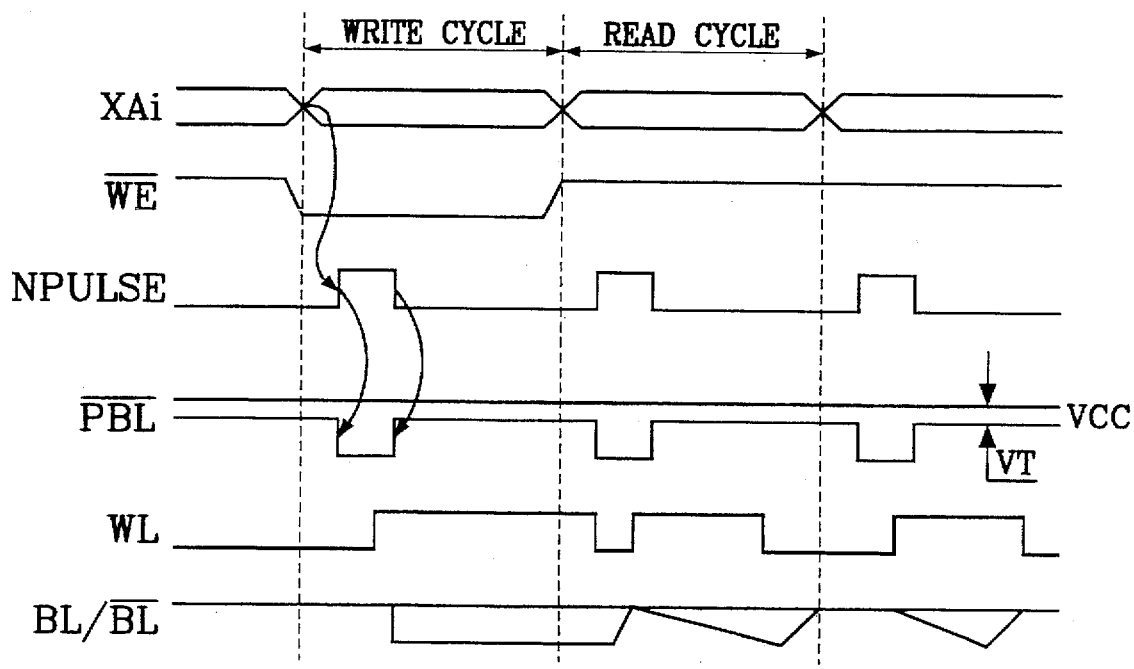
FIG. 5 is a timing diagram for illustrating operation of the circuitry of FIGS. 3A–3C and FIG. 4.

Thus, the bit line control signal /PBL is controlled by Vcc–Vt to control the gates of the precharge transistors 30 and 40 and hence the current consumption. The bit line control signal /PBL voltage is always kept at Vcc–Vt to control the gates of the transistors 30 and 40 so as to keep the precharge transistors turned OFF, except when the pulse signal NPULSE is high. When NPULSE goes high, as shown in FIG. 5, the transistors 22 turns off, and 23 turns on, driving the control signal /PBL low, turning on the precharging transistors 30,40. In this way the circuitry of the present invention controls the current of the precharge transistors 30 and 40 so as to provide substantially the same function as the conventional static precharge transistors. FIG. 5 shows operation responsive to the address transitions XAi, and word line WL and write enable /WE signals. Importantly, it can be observed that the new circuit requires only two transistors for each bit line precharge circuit, as compared to six transistors in the prior art described above.

Although the invention has been described in connection with the specific embodiments illustrated in the attached drawings, it should be readily appreciated by those skilled in this art that various modifications may be made without departing from the scope of the invention.

What is claimed is:

1. A method of precharging a bit line pair in a static semiconductor memory device comprising the steps of:
   detecting a transition in an externally applied address;
   asserting a pulse signal responsive to the detected transition in the externally applied address;
   providing a bit line precharge control signal having a first predetermined voltage level while the said pulse signal is not asserted;
   driving the bit line precharge control signal to a second predetermined voltage level responsive to assertion of the said pulse signal; and
   providing a pair of bit line precharge transistors each arranged between a source voltage and a respective one of the bit line and the complement bit line, the bit line precharge transistors having respective control gates connected to receive the bit line precharge control signal for precharging the bit lines responsive to the bit line precharge control signal, and wherein the first voltage level of the bit line precharge control signal is approximately equal to the source voltage Vcc minus a threshold voltage Vt.

2. A method according to claim 1 wherein the second voltage level is substantially equal to the ground voltage level.

3. A method of precharging a bit line pair in a static semiconductor memory device comprising the steps of:
   detecting a transition in an externally applied address;
   asserting a pulse signal responsive to the detected transition in the externally applied address;
   providing a bit line precharge control signal having a first predetermined voltage level while the said pulse signal is not asserted;
   driving the bit line precharge control signal to a second predetermined voltage level responsive to assertion of the said pulse signal; and
   providing a pair of bit line precharge transistors each arranged between a source voltage and a respective one of the bit line and the complement bit line, the bit line precharge transistors having respective control gates connected to receive the bit line precharge control signal for precharging the bit lines responsive to the bit line precharge control signal, and wherein said step of providing a bit line precharge control signal having a first predetermined voltage level while the said pulse signal is not asserted includes:
      providing a first impedance between the source voltage Vcc and an output node, the first impedance including first and second CMOS transistors having respective channels arranged in series between the source voltage Vcc and the output node;
      providing a second impedance between the output node and ground; and
      obtaining the bit line precharge control signal at the said output node, whereby the voltage level of the bit line precharge control signal is proportional to a ratio of the first impedance to the second impedance.

4. A method according to claim 3 wherein the step of providing a second impedance includes providing third and fourth CMOS transistors having respective channels arranged in series between the said output node and ground.

5. A bit line precharge control signal generating circuit for use in a static semiconductor memory device for controlling precharging of the bit lines, the circuit comprising:

a first impedance means controllably coupled to an output node for pulling up the output node toward a voltage source level Vcc–Vt;

a second impedance means connected to the output node for pulling down the output node toward a ground voltage level; and input means for controllably connecting the first impedance means to the output node so that the output node has a voltage level proportional to a ratio of the first impedance to the second impedance, and disconnecting the output node from the first impedance means so that the output node voltage level goes substantially to ground.

6. A bit line precharge control signal generating circuit according to claim 5 wherein the first impedance means includes a MOS transistor arranged so as to provide a threshold voltage drop.

7. A bit line precharge control signal generating circuit for use in a static semiconductor memory device for controlling precharging of the bit lines, the circuit comprising:

a first impedance means including a MOS transistor arranged so as to provide a threshold voltage drop for controllably coupled to an output node for pulling up the output node toward a voltage source level Vcc–Vt;

a second impedance means connected to the output node for pulling down the output node toward a ground voltage level, wherein the second impedance means includes a plurality of MOS transistors having respective channels arranged in series; and input means for controllably connecting the first impedance means to the output node so that the output node has a voltage level proportional to a ratio of the first impedance to the second impedance, and disconnecting the output node from the first impedance means so that the output node voltage level goes substantially to ground.

8. A bit line precharge control signal generating circuit according to claim 7 wherein the input means receives a control pulse responsive to a detected transition in an externally applied address signal.

9. In a static random access memory including a plurality of bit line pairs, a memory cell connected between each pair of said bit lines, and an address transition detection circuit for detecting transition of the externally applied address signal to generate a detection pulse signal, a bit line precharge circuit comprising:

a bit line control signal generator for generating a bit line control signal in a range between the voltage obtained by subtracting the threshold voltage from a source voltage and ground voltage; and a plurality of precharge transistors with the channels cascaded between said source voltage and bit line pair and the gates being controlled by said bit line control signal.

10. A bit line precharge circuit as defined in claim 9, wherein said bit line control signal generator further comprises a first to a third transistor with the channels cascaded between said source voltage and ground voltage, a first and a second NMOS transistor with the channels connected between the bit line control signal node connecting the drain of said second transistor and the source of said third transistor and said ground voltage, wherein the gate of said first transistor is connected with the source of said second transistor, and said detection pulse signal is applied to the node connecting the gates of said second and third transistor.

11. A bit line precharge circuit as defined in claim 9, wherein said precharge transistors are PMOS transistors.

12. A bit line precharge circuit as defined in claim 9, wherein said first and second transistors are PMOS transistors, and said third transistor is an NMOS transistor.

* * * * *